United States Patent

Balderes et al.

[11] Patent Number: 4,483,389
[45] Date of Patent: Nov. 20, 1984

[54] TELESCOPING THERMAL CONDUCTION ELEMENT FOR SEMICONDUCTOR DEVICES

[75] Inventors: Demetrios Balderes, Wappingers Falls; Joseph L. Horvath; Lewis D. Lipschutz, both of Poughkeepsie, all of N.Y.

[73] Assignee: International Business Machines Corporation, Armonk, N.Y.

[21] Appl. No.: 356,677

[22] Filed: Mar. 10, 1982

[51] Int. Cl.³ .......................................... H01L 23/40
[52] U.S. Cl. ............................ 165/80 B; 174/16 HS; 357/79; 357/81; 361/386
[58] Field of Search ................... 165/185, 80 B, 80 D, 165/80 R; 357/79, 81; 361/386; 174/16 HS

[56] References Cited

U.S. PATENT DOCUMENTS

| 2,905,742 | 9/1959 | Woods | 165/80 B |
| 2,973,400 | 2/1961 | McAdam | 165/80 B X |
| 3,106,601 | 10/1963 | Hamm | 165/80 B |
| 3,249,680 | 4/1964 | Sheets et al. | 174/15 |
| 4,246,597 | 1/1981 | Cole et al. | 165/80 D X |
| 4,295,152 | 10/1981 | Khoe et al. | 357/81 |

FOREIGN PATENT DOCUMENTS 703015 2/1965 Canada .................................. 165/80

OTHER PUBLICATIONS

IBM TDB, vol. 20, No. 6, Nov. 1977, p. 2829.
IBM TDB, vol. 19, No. 12, May 1977, p. 4622.

Primary Examiner—Stephen F. Husar
Attorney, Agent, or Firm—Wolmar J. Stoffel

[57] ABSTRACT

A telescoping heat exchange element for conducting heat in a semiconductor package from a device to a spaced heat sink having a first cup-shaped member, a second cup-shaped member positioned in telescoping slidable relation with the first member, and a means to provide a firm sliding contact between the first and second members.

12 Claims, 5 Drawing Figures

TELESCOPING THERMAL CONDUCTION ELEMENT FOR SEMICONDUCTOR DEVICES

DESCRIPTION

Technical Field

Our invention relates to techniques and structure for the dissipation of thermal energy generated by semiconductor devices during their operation. More particularly, the present invention relates to conduction elements for cooling semiconductor devices in single device or multi-device integrated circuit package assemblies where the devices are mounted on substrates with solder bonds, and the heat sink or cover is mounted in close proximity to the back side of the devices.

The high circuit densities in modern integrated circuit semiconductor devices require that the heat generated by their operation be efficiently removed in order to maintain the temperature of the devices within limits that will keep the operating parameters of the device within pre-determined ranges, and also prevent the destruction of the device by overheating. The problems associated with heat removal are increased when the device is connected to the supporting substrate with solder terminals that electrically connect the device to appropriate terminals on the substrate. In such solder bonded devices, the heat transfer that can be accomplished through the solder bonds is limited, as compared to back bonded devices. Cooling of the semiconductors can be achieved by immersing the devices in a suitable liquid coolant as disclosed in U.S. Pat. No. 3,741,292. However, these cooling techniques can result in corrosion of the device and the substrate metallurgy, and also present problems if the package must be disassembled and repaired. Cooling can also be achieved by providing a heat conductive link of material, such as cooling pistons, as described in U.S. Pat. No. 3,993,123 or immovable elements between the device and cap or cold plate as described in U.S Pat. No. 4,069,498. These elements must be capable of consistently forming and maintaining a good interface contact between the semiconductor device and the cooling plate or cover over as large an area as possible in order to maintain a low thermal resistance. With cooling pistons, forming and maintaining such interface contact is difficult because the devices may be tilted relative to the substrate, resulting in an unsatisfactory point or line contact. In general, cooling pistons must be used in an atmosphere of inert gases with a higher heat conductivity than air, or a grease or other conformal means be provided at the piston end—device interface. Another disadvantage is that the pistons may subject the devices being cooled to shock when the package is subjected to inertial forces. Spring elements for thermal conduction between a device and cold plate are known. A prevalent problem in designing sufficiently heavy springs that will efficiently conduct heat and accommodate for spacing tolerances, and yet not impose destructive forces on the device that will crack or chip them. The consideration becomes more severe as the tolerance of the gap between the device and cap are increased. In general, the known spring elements when made heavy enough to efficiently conduct heat become too stiff to accommodate for spacing variations without imposing potentially damaging stresses on the device. Conversely, when the spring elements are made sufficiently thin and flexible to accommodate for spacing tolerance, the thickness will not have sufficient capability for transferring heat away from the device to meet the cooling requirements. What is needed in the semiconductor packaging technology is an inexpensive, extensable conduction element with good thermal conduction characteristics that can accommodate for tilted devices while yet achieving a firm area contact between the telescoping elements.

DISCLOSURE OF INVENTION

In accordance with the present invention, we provide a compliant heat exchange telescoping element for conducting heat in a semiconductor package from a semiconductor device mounted on a substrate to a spaced heat sink or cover having a first cup-shaped member formed of heat conductive material provided with a flat bottom surface and an annular wall, a second cup-shaped member formed of heat conductive material provided with a flat bottom surface and an annular resilient slotted wall juxtaposed in telescoping slidable relation to said wall of said first cup-shaped member, and a means to assure a uniform, dependable sliding contact between the walls of the first cup-shaped member and the resilient slotted wall of the second cup-shaped member.

BRIEF DESCRIPTION OF THE DRAWINGS

The details of our invention will be described in connection with the accompanying drawings in which.

Figure 1:
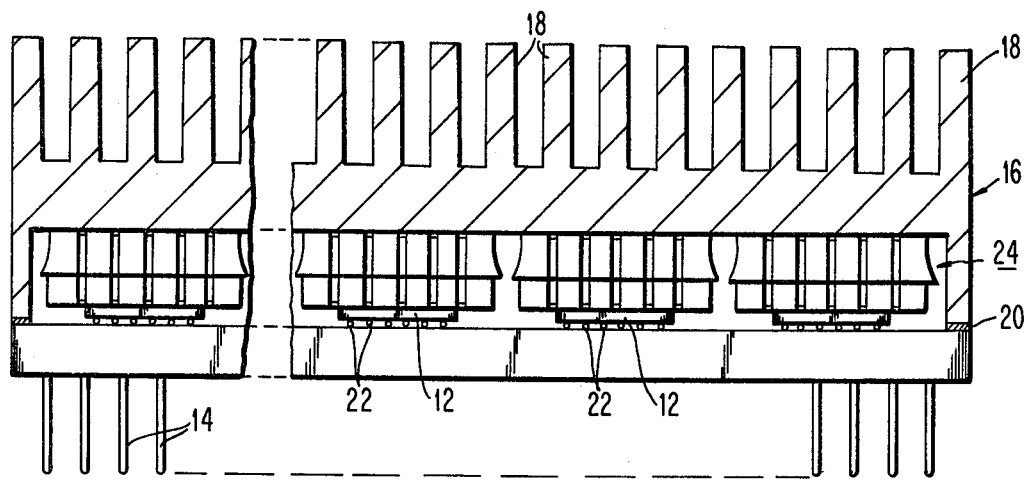
FIG. 1 is an elevational view in broken section in enlarged scale of a semiconductor package illustrating the heat exchange element of our invention and its relationship to the device and cold plate.

Referring now to the drawings, and FIG. 1, in particular, there is illustrated a semiconductor package made up of a substrate 10 with a metallurgy pattern (not shown) within or on the top surface of the substrate that interconnects semiconductor devices 12 mounted thereon and pins 14 extending from the bottom surface. A typical cap 16 provided with fins 18 is secured to substrate 10 by a braze seal 20. The devices 12 are electrically connected to the metallurgy system on or within the substrate by solder interconnections 22. In operation, the devices 12 generate heat that must be dissipated. A portion of the heat generated is conducted through the solder bonds 22 to substrate 10. However, with high performance integrated semiconductor devices the heat conduction through solder bonds 22 is ordinarily not sufficient to maintain the temperature of the semiconductor devices within workable limits. In this invention heat is removed from the device 22 to the overlying cap 16 by a telescoping heat exchange element 24.

Figure 2:
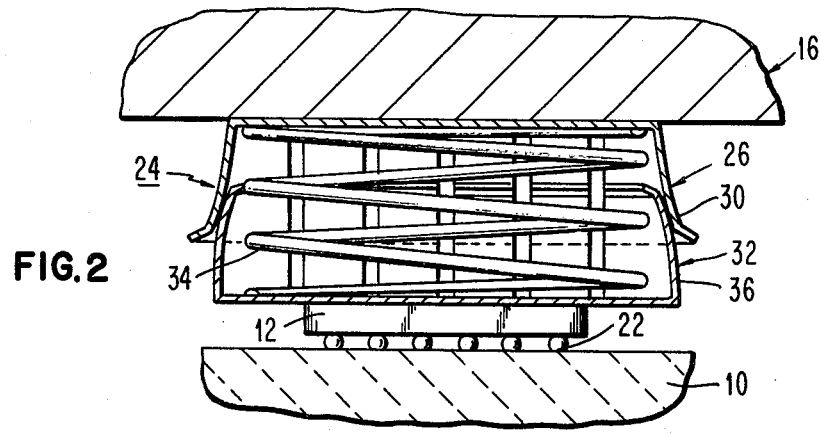
FIG. 2 is an elevational view in greatly enlarged scale illustrating a first embodiment of the telescoping heat exchange element of our invention.

Referring now to FIG. 2 there is shown in greatly enlarged scale an embodiment 24 of the heat exchange telescoping element of the invention. The heat exchange element 24 has a first cup-shaped member 26 formed of a heat conductive metal and provided with a flat bottom surface 28 in contact with cover 16, and an annular wall 30. Cup-shaped member 26 can be formed from any suitable metal, as for example copper, silver or alloys thereof. Preferably the metal used is spring-like in its action so that the walls are resilient. Walls 30 are preferably slotted which will allow portions of the wall to flex independently of the remaining portion of the wall. The cup member 26 is preferably square in cross-section, but can be rectangular or circular if desired. The thickness of the metal of the cup member can be any suitable thickness, typically in the range of 0.003 to 0.020 inches. A second cup-shaped member 32 formed of heat conductive material and provided with a flat bottom surface 34 and an annular resilient slotted wall 36 is juxtaposed in telescoping slidable relation to cup member 26. Preferably the upper portion of the wall 30 of member 26 is flared outwardly and the upper portion of walls 36 of member 32 are inclined inwardly in order to facilitate assembly of the cup-shaped members 26 and 32. Preferably the inside width dimension of cup 26 corresponds to the outside width dimension of cup 32. When the members 26 and 32 are forced inwardly in closer telescoping relation, the sliding contact between the walls 30 and 36 is an annular area contact. In the position shown in FIG. 2, the area of contact between the members 26 and 32 is a line contact. However, the arcuate flared end portions of walls 30 and 36 are exaggerated in FIG. 2 to more clearly illustrate the structure. A suitable spring 38 can be provided to push the flat surfaces 28 and 34 of the cups 26 and 32 against the chip 12 and cap 16.

Figure 3:
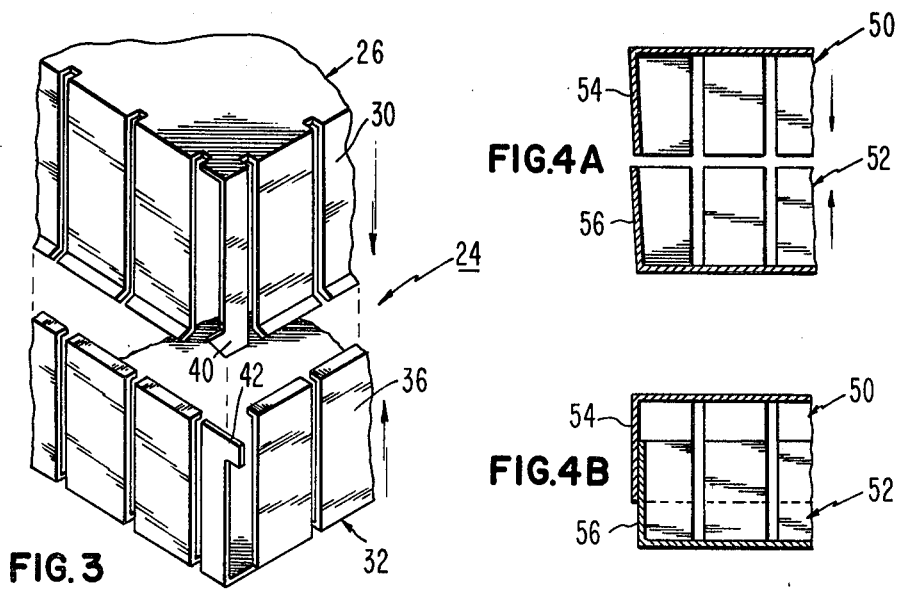
FIG. 3 is a detailed view of a specific embodiment of our invention for preventing separation of the cup-shaped members.

Referring now to FIG. 3 there is illustrated a locking mechanism to keep the nested cup-shaped members 26 and 32 from coming apart after they are assembled with or without an internal spring. On each corner of the heat exchange element, there is provided a set of hooking means which prevents the cup from coming apart. More specifically, as shown in FIG. 3, an extension 40 on the upper portion of a tab on wall 30 mates with a corresponding extension 42 on the end tab of wall 36. Upon placing the cup members into telescoping relationship, one or both of the tabs will be bent outwardly permitting the tabs 40 and 42 to become engaged. The cups can be disassembled if necessary by simultaneously bending each of the corner tabs outwardly permitting the extensions to pass. Separation of the cups is prevented, but they are free to increase or decrease their overlap to accommodate chip to cap variation.

One or both of the cup members 26 and 32 can be provided with slots. The slot divides the wall into segments thereby assuring a firm sliding contact. The resilience of the walls also assure firm sliding contact which materially decreases the external resistance of the assembly permitting an efficient transfer of heat from the devices 12 to the overlying cap or heat sink. The heat exchange telescoping element of the invention is relatively inexpensive since it does not require precision machining necessary to obtain a close firm sliding contact between the caps. Further, the telescoping element of the invention has low mass and is therefore very unlikely to damage the chip in the package if the package is exposed to large inertial forces. The low mass of the element 24 therefore applies a minimal force to the chip. In addition, it is capable of bridging gaps of varying width between the device and the cap. In addition, the heat exchange element is capable of accommodating tilted devices on substrate 10 because the bottom cup 32 can adjust to a tilted surface due to the resiliency of the walls 30 and 36. At the same time the surface contact between the cup members 26 and 32 is maintained in either a line or surface contact which lowers the thermal resistance of the unit.

Figure 4A:
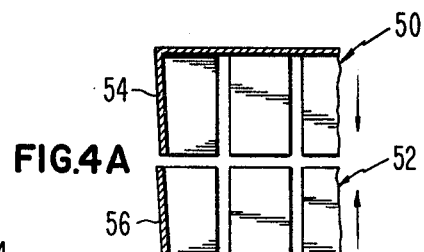
FIG. 4A is an elevational view in broken section illustrating another specific embodiment of the heat exchange element of our invention in unassembled relation.
Figure 4B:
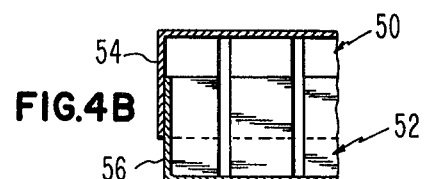
FIG. 4B is an elevational view in broken section illustrating the members of the heat exchange element embodiment of FIG. 4 in assembled relation.

Referring now to FIGS. 4A and 4B, there is depicted another embodiment of our invention. In this embodiment telescoping cup-like members 50 and 52 provide thermal conduction to cool devices in the same manner as described previously with regard to element 24. However, the end portions of walls 54 and 56 are not curved. Consequently, a surface area contact is obtained between the cup-like members 50 and 52 at all times. The area of the contact will, of course, vary depending on the relative positions of the members.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

We claim:

1. A compliant telescoping heat exchange element for conducting heat in a semiconductor package from a semiconductor device to a spaced heat sink comprising
    a first cup-shaped member formed of heat conductive metal provided with a flat bottom surface adapted to be placed in contact with a surface of said semiconductor device, and an annular wall,
    a second cup-shaped member formed of heat conductive metal provided with a flat bottom surface adapted to be placed in contact with a surface of said heat sink, and an annular resilient slotted wall juxtaposed in telescoping slidable relation to said wall of said first cup-shaped member,
    means to provide a firm sliding contact between said wall of said first cup-shaped member and the resilient slotted wall of said second cup-shaped member.

2. The heat exchange element of claim 1 wherein said means to provide firm sliding contact is comprised of
    an outward flaring of said wall of said second cup-shaped member, said outwardly flared wall maintained under stress by the said wall of said first cup-shaped member.

3. The heat exchange element of claim 2 wherein said wall of said first cup-shaped member is substantially perpendicular to said bottom surface, whereby an area contact is obtained between said walls of said first and said second cup-shaped members.

4. The heat exchange element of claim 3 wherein said bottom surfaces of said cup-shaped members are rectangular or square.

5. The heat exchange element of claim 3 wherein said bottom surfaces of said cup-shaped members are circular.

6. The heat exchange element of claim 3 wherein said heat conductive metal of said cup-shaped members is selected from a metal consisting of copper, silver and alloys thereof.

7. The heat exchange element of claim 1 wherein said means to provide firm sliding contact between said walls of said first cup-shaped member and the wall of said second cup-shaped member is comprised of
    an outwardly flared arcuate end portion on said wall of said second cup-shaped member, an inwardly directed arcuate end portion on said wall of said first cup-shaped member, said flared arcuate end portion and said inwardly directed arcuate surface maintaining sliding contact and also providing a force to bias said cup-shaped members in extended relation.

8. The heat exchange element of claim 7 wherein said wall of said first cup-shaped member is slotted.

9. The heat exchange element of claim 8 wherein said bottom surfaces of said first and said second cup shaped members are square or rectangular.

10. The heat exchange element of claim 1 which further includes a spring means to bias said cup-shaped members in extensible relation.

11. The heat exchange element of claim 10 which further includes interlocking corner tabs on said walls of said cup-shaped members that prevents separation of said members.

12. The heat exchange element of claim 1 wherein the annular wall of said first cup-shaped member and the annular wall of said second cup-shaped member are straight, and the inside dimensions of said first cup-shaped member correspond to the outside dimensions of said second cup-shaped member, said members when in telescoping relationship have an area wall contact.

* * * * *